(12) United States Patent
Chang et al.

(10) Patent No.: US 11,817,826 B2
(45) Date of Patent: Nov. 14, 2023

(54) FREQUENCY MIXER INCLUDING NON-LINEAR CIRCUIT

(71) Applicant: Electronics and Telecommunications Research Institute, Daejeon (KR)

(72) Inventors: Woojin Chang, Daejeon (KR); Dong Min Kang, Daejeon (KR); Byoung-Gue Min, Daejeon (KR); Jong Yul Park, Daejeon (KR); Jongmin Lee, Daejeon (KR); Yoo Jin Jang, Daejeon (KR); Kyu Jun Cho, Daejeon (KR); Hong Gu Ji, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/886,061

(22) Filed: Aug. 11, 2022

(65) Prior Publication Data
US 2023/0142553 A1     May 11, 2023

(30) Foreign Application Priority Data

Nov. 8, 2021   (KR) .................. 10-2021-0152302
Feb. 22, 2022  (KR) .................. 10-2022-0023220

(51) Int. Cl.
*H03D 7/12*    (2006.01)
*H03H 7/38*    (2006.01)
*H03D 7/14*    (2006.01)

(52) U.S. Cl.
CPC .............. *H03D 7/125* (2013.01); *H03D 7/14* (2013.01); *H03H 7/38* (2013.01)

(58) Field of Classification Search
CPC ........ H03D 7/125; H03D 7/14; H03D 7/1425; H03D 7/1441; H03D 7/1466; H03D 7/1483; H03D 2200/009; H03H 7/38
See application file for complete search history.

(56) References Cited

U.S. PATENT DOCUMENTS

| | | | |
|---|---|---|---|
| 4,592,095 A | 5/1986 | Ohnishi et al. | |
| 5,396,132 A | 3/1995 | Shiga | |
| 5,789,963 A | 8/1998 | Sakusabe | |
| 5,884,154 A | 3/1999 | Sano et al. | |
| 6,351,632 B1 | 2/2002 | Yan et al. | |
| 6,388,501 B2 | 5/2002 | Chien | |
| 7,840,197 B2 | 11/2010 | Mirzaei et al. | |
| 7,962,114 B2 | 6/2011 | Garcia et al. | |

(Continued)

FOREIGN PATENT DOCUMENTS

JP   H 9-214253 A   8/1997
KR   10-0668365 B1  1/2007

*Primary Examiner* — Long Nguyen
(74) *Attorney, Agent, or Firm* — NSIP Law

(57) ABSTRACT

Disclosed is a frequency mixer. The frequency mixer includes a first matching circuit that generates a matched local oscillator (LO) signal based on an LO signal, a non-linear circuit that generates a non-linear LO signal based on the matched LO signal, a second matching circuit that generates a matched radio frequency (RF) signal based on an RF signal, a mixing circuit that generates a mixed signal based on a mixing of the non-linear LO signal and the matched RF signal, a third matching circuit that generates an intermediate frequency (IF) signal based on the mixed signal, wherein the non-linear circuit includes a non-linear transistor, a bias transistor, and an internal matching circuit connected in series.

16 Claims, 6 Drawing Sheets

(56) References Cited

U.S. PATENT DOCUMENTS

| | | |
|---|---|---|
| 7,995,983 B2 | 8/2011 | Reynolds |
| 8,183,896 B2 * | 5/2012 | Jung ................. H03D 7/125 |
| | | 455/333 |
| 11,101,772 B2 | 8/2021 | Hamada et al. |
| 2009/0181634 A1 | 7/2009 | Jung et al. |
| 2011/0140746 A1 | 6/2011 | Park et al. |
| 2011/0148478 A1 | 6/2011 | Kang et al. |
| 2011/0183641 A1 | 7/2011 | Garcia et al. |
| 2020/0412300 A1 | 12/2020 | Hamada et al. |
| 2021/0111674 A1 * | 4/2021 | Hamada ............... H03D 7/125 |

* cited by examiner

FREQUENCY MIXER INCLUDING NON-LINEAR CIRCUIT

CROSS-REFERENCE TO RELATED APPLICATIONS

This application claims priority under 35 U.S.C. § 119 to Korean Patent Application Nos. 10-2021-0152302 filed on Nov. 8, 2021, and 10-2022-0023220 filed on Feb. 22, 2022, in the Korean Intellectual Property Office, the disclosures of which are incorporated by reference herein in their entireties.

BACKGROUND

Embodiments of the present disclosure described herein relate to a frequency mixer, and more particularly, relate to a frequency mixer including a non-linear circuit.

A frequency mixer is a device for mixing different frequency signals. For example, the frequency mixer may generate a frequency output signal corresponding to the sum or difference of different frequency input signals by using the non-linear characteristic. A frequency mixer that generates a frequency output signal corresponding to the sum of different frequency input signals may be referred to as an up-conversion frequency mixer. A frequency mixer that generates a frequency output signal corresponding to a difference between different frequency input signals may be referred to as a down-conversion frequency mixer.

The frequency mixer may be used in various electronic systems based on wireless communication. The degradation of the frequency mixer may cause a decrease in signal sensitivity, data loss, an increase in the error rate, and the like in electronic systems. Examples of quality factors of a frequency mixer include insertion loss, linearity, port-to-port isolation, and the like. In an electronic system including a frequency mixer, a frequency mixer with improved quality factors such as insertion loss, linearity, and port-to-port isolation may be required to ensure signal sensitivity improvement, reliability improvement, and the like.

SUMMARY

Embodiments of the present disclosure provide a frequency mixer including a non-linear circuit.

According to an embodiment, a frequency mixer includes a first matching circuit that generates a matched local oscillator (LO) signal based on an LO signal, a non-linear circuit that generates a non-linear LO signal based on the matched LO signal, a second matching circuit that generates a matched radio frequency (RF) signal based on an RF signal, a mixing circuit that generates a mixed signal based on a mixing of the non-linear LO signal and the matched RF signal, a third matching circuit that generates an intermediate frequency (IF) signal based on the mixed signal, wherein the non-linear circuit includes a non-linear transistor, a bias transistor, and an internal matching circuit connected in series.

In an embodiment, the internal matching circuit may include a resistor, an inductor and a capacitor which are connected in parallel.

In an embodiment, a resistance of the resistor, an inductance of the inductor, and a capacitance of the capacitor may be optimized to enhance at least one of an LO-to-RF isolation, an RF-to-LO isolation and an LO-to-IF isolation of the frequency mixer.

In an embodiment, the bias transistor may operate in response to a bias voltage, and a level of the bias voltage may be optimized to enhance at least one of an LO-to-RF isolation, an RF-to-LO isolation and an LO-to-IF isolation of the frequency mixer.

In an embodiment, the bias transistor may operate in response to a bias voltage, and a level of the bias voltage may be optimized to enhance at least one of an LO-to-RF isolation, an RF-to-LO isolation and an LO-to-IF isolation of the frequency mixer for a process change of an active element and a process change of a passive element occurring in a process of manufacturing the frequency mixer.

In an embodiment, the non-linear circuit may be connected between a terminal through which the non-linear LO signal is generated and a first node to operate in response to the matched LO signal, wherein the bias transistor may be connected between the first node and a second node to operate in response to a bias voltage, and the internal matching circuit may be connected between the second node and a ground node.

In an embodiment, the non-linear circuit may further include a bias voltage source configured to provide the bias voltage to a gate terminal of the bias transistor.

In an embodiment, the internal matching circuit may include a resistor connected between the second node and the ground node, an inductor connected between the second node and the ground node, and a capacitor connected between the second node and the ground node.

In an embodiment, a drain terminal of the non-linear transistor may be connected to the terminal through which the non-linear LO signal is generated, and a source terminal of the non-linear transistor may be connected to the first node, wherein a drain terminal of the bias transistor may be connected to the first node and a source terminal of the bias transistor may be connected to the second node.

In an embodiment, each of the non-linear transistor and the bias transistor may be implemented with at least one of an N-channel metal oxide semiconductor (NMOS) transistor, a GaAs pseudomorphic high electron mobility transistor (PHEMT), a GaAs metamorphic high electron mobility transistor (MHEMT), an InP high electron mobility transistor (HEMT), and a GaN field effect transistor (FET).

In an embodiment, the frequency mixer may include a down-conversion frequency mixer that generates the IF signal having a third frequency obtained by subtracting a second frequency of the LO signal from a first frequency of the RF signal.

According to another embodiment, a frequency mixer matches a local oscillator (LO) signal, generates a non-linear LO signal based on a matched LO signal, and generates an intermediate frequency (IF) signal based on the non-linear LO signal and a radio frequency (RF) signal. The frequency mixer includes a first transistor connected between a terminal through which the non-linear LO signal is generated and a first node to operate in response to the matched LO signal, a second transistor connected between the first node and a second node to operate in response to a bias voltage, and an internal matching circuit connected between the second node and a ground node.

In an embodiment, the internal matching circuit may include a resistor connected between the second node and the ground node, an inductor connected between the second node and the ground node, and a capacitor connected between the second node and the ground node.

In an embodiment, a resistance of the resistor, an inductance of the inductor, and a capacitance of the capacitor may be optimized to enhance at least one of an LO-to-RF isolation, an RF-to-LO isolation and an LO-to-IF isolation of the frequency mixer.

In an embodiment, the frequency mixer may further include a bias voltage source that provides the bias voltage to a gate terminal of the second transistor.

In an embodiment, a level of the bias voltage may be optimized to enhance at least one of an LO-to-RF isolation, an RF-to-LO isolation and an LO-to-IF isolation of the frequency mixer for a process change of an active element and a process change of a passive element occurring in a process of manufacturing the frequency mixer.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
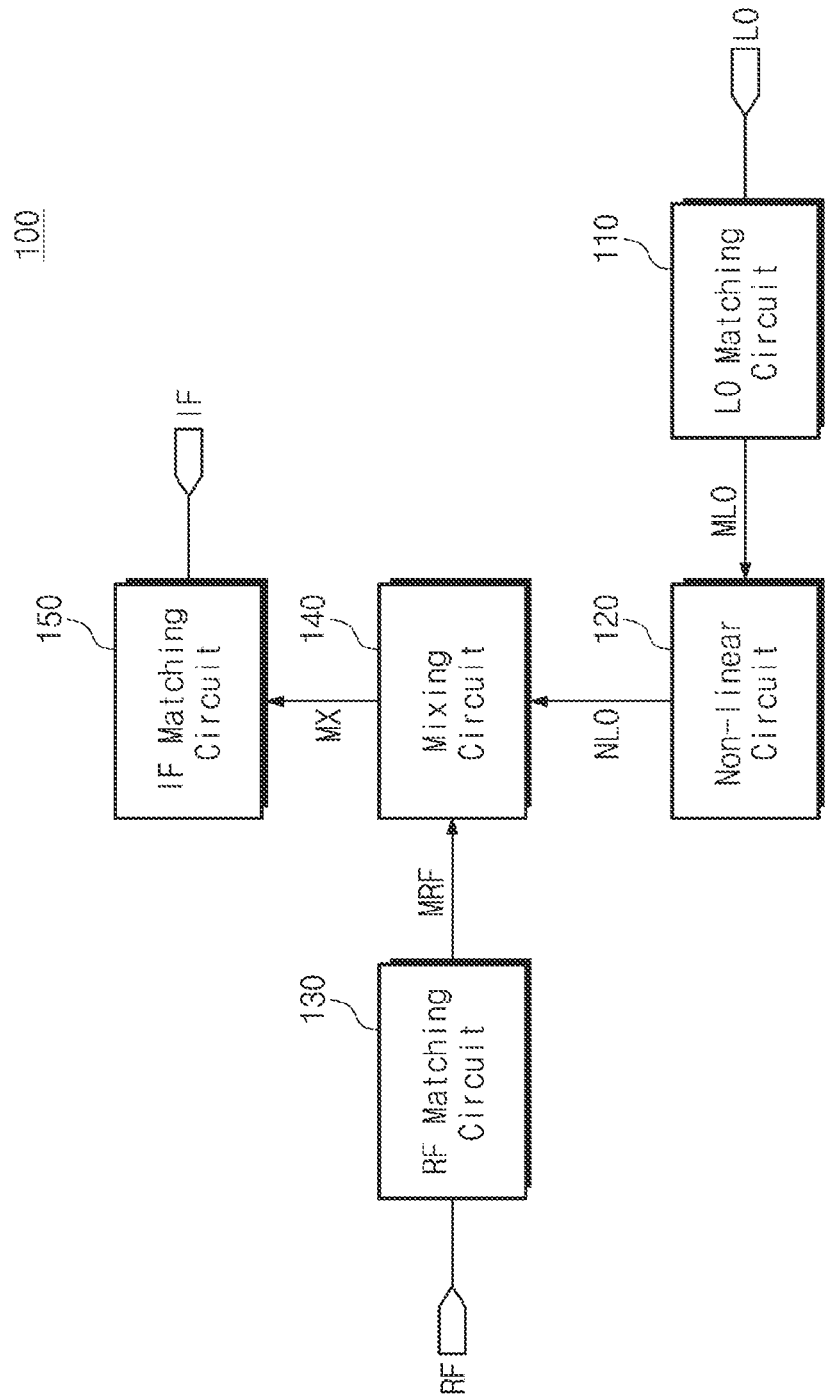
FIG. 1 is a block diagram illustrating a frequency mixer according to an embodiment of the present disclosure.

Hereinafter, various embodiments of the present disclosure will be described clearly and in detail, so that those skilled in the art can easily carry out the present disclosure.

Terms such as "unit" and "module" used below or functional blocks shown in the drawings may be implemented in the form of software, hardware or a combination thereof. Hereinafter, in order to clearly explain the technical spirit of the present disclosure, duplicate descriptions of the same components may be omitted.

FIG. 1 is a block diagram illustrating a frequency mixer according to an embodiment of the present disclosure. Referring to FIG. 1, a frequency mixer 100 may generate an intermediate frequency (IF) signal based on a radio frequency (RF) signal and a local oscillator (LO) signal.

The frequency mixer 100 may be a device for mixing different frequency signals. For example, the frequency mixer 100 may be implemented as an up-conversion frequency mixer that generates a frequency output signal corresponding to the sum of different frequency input signals by using non-linearity. Alternatively, the frequency mixer 100 may be implemented as a down-conversion frequency mixer that generates a frequency output signal corresponding to a difference between different frequency input signals using non-linearity.

When the frequency mixer 100 is implemented as an up-conversion frequency mixer, the frequency mixer 100 may generate an IF signal having a frequency obtained by adding the frequency of the LO signal to the frequency of the RF signal.

When the frequency mixer 100 is implemented as a down-conversion frequency mixer, the frequency mixer 100 may generate an IF signal having a frequency obtained by subtracting the frequency of the LO signal from the frequency of the RF signal.

The frequency mixer 100 may include an LO matching circuit 110, a non-linear circuit 120, an RF matching circuit 130, a mixing circuit 140, and an IF matching circuit 150.

The LO matching circuit 110 may receive the LO signal through an LO port. The LO matching circuit 110 may generate a matched LO (MLO) signal based on the LO signal. The LO matching circuit 110 may provide the MLO signal to the non-linear circuit 120.

The non-linear circuit 120 may receive the MLO signal from the LO matching circuit 110. The non-linear circuit 120 may generate a non-linear LO (NLO) signal based on the MLO signal. The NLO signal may be a signal that is obtained by modulating the MLO signal based on non-linearity. The non-linear circuit 120 may provide an NLO signal to the mixing circuit 140.

In some embodiments, the non-linear circuit 120 may include a first transistor, a second transistor, and an internal matching circuit connected in series. Based on the circuit structure of the non-linear circuit 120, quality factors such as insertion loss, isolation between ports, and the like may be improved.

For example, the frequency mixer 100 may be used in various wireless communication-based electronic systems. The frequency mixed by the frequency mixer 100 may be used for wireless communication. Degradation of frequency mixers may lead to reduced signal sensitivity, data loss, and increased error rates in electronic systems. As examples of quality factors of a frequency mixer, there are insertion loss, linearity, port-to-port isolation, and the like. By improving the quality factors based on the circuit structure of the non-linear circuit 120, it is possible to improve the communication performance of the electronic system including the frequency mixer. The details of the non-linear circuit 120 will be described below with reference to FIG. 3.

The RF matching circuit 130 may receive an RF signal through an RF port. The RF matching circuit 130 may generate a matched RF (MRF) signal based on the RF signal. The RF matching circuit 130 may provide the MRF signal to the mixing circuit 140.

The mixing circuit 140 may receive the NLO signal from the non-linear circuit 120. The mixing circuit 140 may receive the MRF signal from the RF matching circuit 130. The mixing circuit 140 may generate a mixed (MX) signal based on the mixing of the NLO signal and the MRF signal. The mixing circuit 140 may provide the MX signal to the IF matching circuit 150.

The IF matching circuit 150 may generate an IF signal based on the MX signal. The IF matching circuit 150 may provide the IF signal to an IF port.

Figure 2:
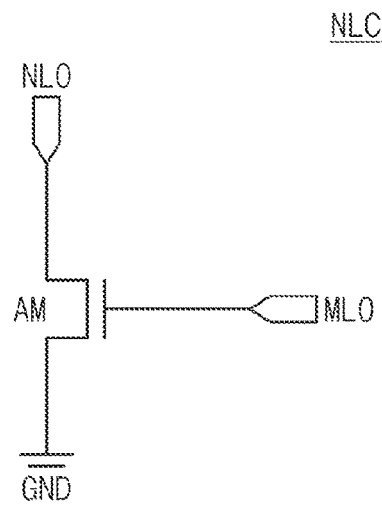
FIG. 2 is a circuit diagram illustrating a general non-linear circuit.

FIG. 2 is a circuit diagram illustrating a general non-linear circuit. Referring to FIG. 2, a circuit diagram of a general non-linear circuit (NLC) is illustrated. The general non-linear circuit NLC may correspond to the non-linear circuit 120 of FIG. 1 according to an embodiment of the present disclosure. The general non-linear circuit NLC is only described to help the understanding of the non-linear circuit 120 of the present disclosure, and the general non-linear circuit NLC may include other components that do not constitute the related literature.

The general non-linear circuit NLC may generate an NLO signal based on the MLO signal. For example, the general non-linear circuit NLC may receive an MLO signal from the LO matching circuit 110 of FIG. 1, generate the NLO signal based on the MLO signal, and provide the NLO signal to the mixing circuit 140 of FIG. 1.

The general non-linear circuit NLC may include a non-linear transistor AM. The non-linear transistor AM may be connected between the terminal through which the NLO signal is generated and a ground node GND. The non-linear transistor AM may operate in response to the MLO signal. That is, the non-linear transistor AM may non-linearly modulate the MLO signal to generate the NLO signal.

Figure 3:
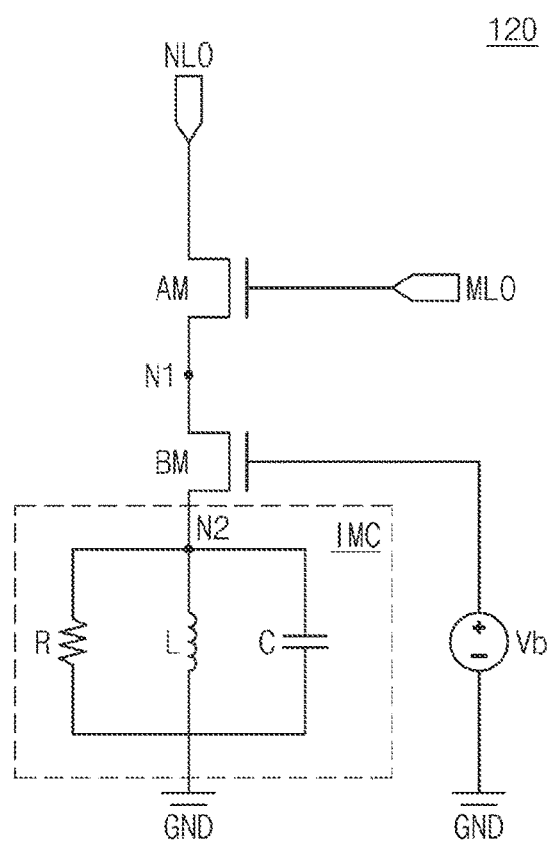
FIG. 3 is a circuit diagram illustrating the non-linear circuit of FIG. 1 according to some embodiments of the present disclosure.

FIG. 3 is a circuit diagram illustrating the non-linear circuit of FIG. 1 according to some embodiments of the present disclosure. Referring to FIGS. 1 and 3, a circuit diagram of the non-linear circuit 120 according to some embodiments of the present disclosure is shown. The non-linear circuit 120 may correspond to the non-linear circuit 120 of FIG. 1.

The non-linear circuit 120 may generate the NLO signal based on the MLO signal. For example, the non-linear circuit 120 may receive the MLO signal from the LO matching circuit 110, generate the NLO signal based on the MLO signal, and provide the NLO signal to the mixing circuit 140.

The non-linear circuit 120 may include the non-linear transistor AM, a bias transistor BM, an internal matching circuit IMC, and a bias voltage source Vb. The non-linear transistor AM, the bias transistor BM and the internal matching circuit IMC may be connected in series. The non-linear transistor AM and the bias transistor BM may also be referred to as a first transistor and a second transistor, respectively.

The non-linear transistor AM may be connected between a terminal through which the NLO signal is generated and a first node N1. The non-linear transistor AM may operate in response to the MLO signal. That is, the non-linear transistor AM may non-linearly modulate the MLO signal to generate the NLO signal.

In some embodiments, the non-linear transistor AM may be implemented as an N-channel metal oxide semiconductor (NMOS) transistor. For example, a source node, a gate node, and a drain node of the non-linear transistor AM may be connected to the first node N1, a terminal for receiving an MLO signal, and a terminal for generating an NLO signal, respectively.

The bias transistor BM may be connected between the first node N1 and a second node N2. The bias transistor BM may operate in response to a bias voltage. For example, the bias transistor BM may receive the bias voltage from the bias voltage source Vb. The bias voltage may be a gate bias capable of turning on or off the bias transistor BM. As the bias transistor BM is turned on or off according to the bias voltage, parasitic component values of the bias transistor BM may vary.

In addition, the bias voltage may be determined as one of several voltage values greater than or equal to a threshold voltage of the bias transistor BM. The bias voltage may be adjusted to improve the isolation of the frequency mixer 100 in consideration of the parasitic component values of the bias transistor BM and the combined impedance value of the internal matching circuit IMC connected to the bias transistor BM.

For example, the bias transistor BM may be adjusted to allow a specific frequency component of the electrical signal output from the non-linear transistor AM to escape through the internal matching circuit IMC according to the bias voltage, so that it is possible to attenuate a frequency component transmitted between different ports (e.g., LO, RF and IF ports) of the frequency mixer 100. That is, the bias transistor BM may enable matching between different frequency signals (RF signal, LO signal, and IF signal).

The bias voltage source Vb may be connected to the bias transistor BM and the ground node GND. The bias voltage source Vb may provide a bias voltage to the bias transistor BM.

In some embodiments, the bias transistor BM may be implemented as an NMOS transistor. For example, a source node, a gate node, and a drain node of the bias transistor BM may be connected to the second node N2, the bias voltage source Vb and the first node N1, respectively.

In some embodiments, the bias transistor BM may improve the isolation of the frequency mixer 100. For example, the level of the bias voltage provided to the gate terminal of the bias transistor BM may be optimized to improve at least one of the LO-to-RF isolation, the RF-to-LO isolation and the LO-to-IF isolation of the frequency mixer 100.

In some embodiments, each of the non-linear transistor AM and the bias transistor BM may be implemented with at least one of an N-channel metal oxide semiconductor (NMOS) transistor, a GaAs pseudomorphic high electron mobility transistor (PHEMT), a GaAs metamorphic high electron mobility transistor (MHEMT), an InP high electron mobility transistor (HEMT), and a GaN field effect transistor (FET).

The LO-to-RF isolation may refer to the degree at which the propagation of frequency components is blocked between the LO port and the RF port. The RF-to-LO isolation may refer to the degree at which propagation of frequency components is blocked between the RF port and the LO port. The LO-to-IF isolation may refer to a degree at which propagation of frequency components is blocked between the LO port and the IF port.

In some embodiments, the bias transistor BM may improve the isolation of the frequency mixer 100 in consideration of a process change according to a manufacturing process. For example, the level of the bias voltage provided to the gate terminal of the bias transistor BM may be optimized to improve at least one of the LO-to-RF isolation, the RF-to-LO isolation and the LO-to-IF isolation of the frequency mixer 100 with respect to the process change of the active element and the process change of the passive element occurring in the manufacturing process of the frequency mixer 100.

The internal matching circuit IMC may be connected between the second node N2 and the ground node GND. The internal matching circuit IMC may improve the isolation of the frequency mixer 100 by outputting a specific frequency component of the electrical signal transmitted from the non-linear transistor AM through the bias transistor BM to the ground node GND.

In some embodiments, the internal matching circuit IMC may be implemented as an RLC parallel circuit. For example, the internal matching circuit IMC may include a resistor R, an inductor L and a capacitor C connected in parallel between the second node N2 and the ground node GND.

In some embodiments, the magnitude of the combined impedance of the internal matching circuit IMC may be optimized to improve the isolation of the frequency mixer 100. For example, the internal matching circuit IMC may include the resistor R, the inductor L and the capacitor C connected in parallel. The resistance of the resistor R, the inductance of the inductor L and the capacitance of the capacitor C may be optimized to improve at least one of the LO-to-RF isolation, RF-to-LO isolation and LO-to-IF isolation of the frequency mixer 100.

Figure 4:
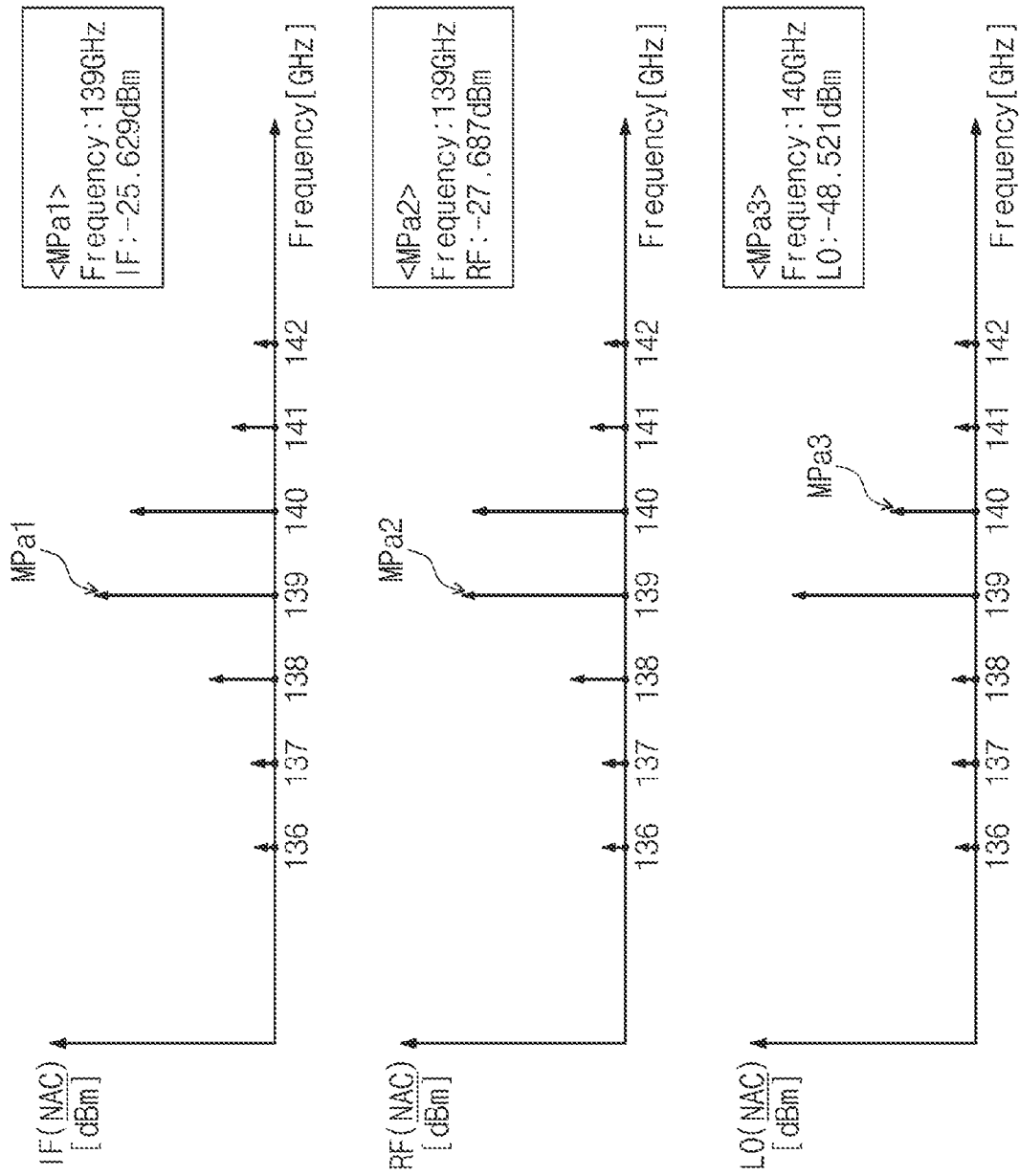
FIG. 4 is a diagram illustrating frequency signals of the non-linear circuit of FIG. 2.

FIG. 4 is a diagram illustrating frequency signals of the non-linear circuit of FIG. 2. Referring to FIGS. 2 and 4, spectral characteristics according to frequencies of an IF signal, an RF signal and an LO signal of a frequency mixer including a general non-linear circuit NLC will be described with reference to graphs. In the graphs, the horizontal axis represents the frequency, and the vertical axis represents the power level.

According to the simulation conditions, the frequency of the RF signal is 140 GHz, the frequency of the LO signal is 139 GHz, and the frequency of the IF signal is 1 GHz. The magnitude of the RF signal is −30 dBm, and the magnitude of the LO signal is −10 dBm.

With reference to the graph of the IF signal, the LO-to-IF isolation will be described. When the frequency of the LO signal is 139 GHz and the magnitude of the LO signal is −10 dBm, a measurement point MPa1 represents −25.629 dBm as a spectral value of the IF signal. Therefore, the LO-to-IF isolation may be calculated as '−10-(−25.629) dBm'. That is, the LO-to-IF isolation is 15.629 dBm.

With reference to the graph of an RF signal, the LO-to-RF isolation will be described. When the frequency of the LO signal is 139 GHz and the magnitude of the LO signal is −10 dBm, a measurement point MPa2 represents −27.687 dBm as a spectrum value of the RF signal. Therefore, the LO-to-RF isolation may be calculated as '−10-(−27.689) dBm'. That is, the LO-to-RF isolation is 17.689 dBm.

With reference to the graph of the LO signal, the RF-to-LO isolation will be described. When the frequency of the RF signal is 140 GHz and the magnitude of the RF signal is −30 dBm, a measurement point MPa3 represents −48.521 dBm as a spectral value of the LO signal. Therefore, the RF-to-LO isolation may be calculated as '−30-(−48.521) dBm'. That is, the RF-to-LO isolation is 18.521 dBm.

Figure 5:
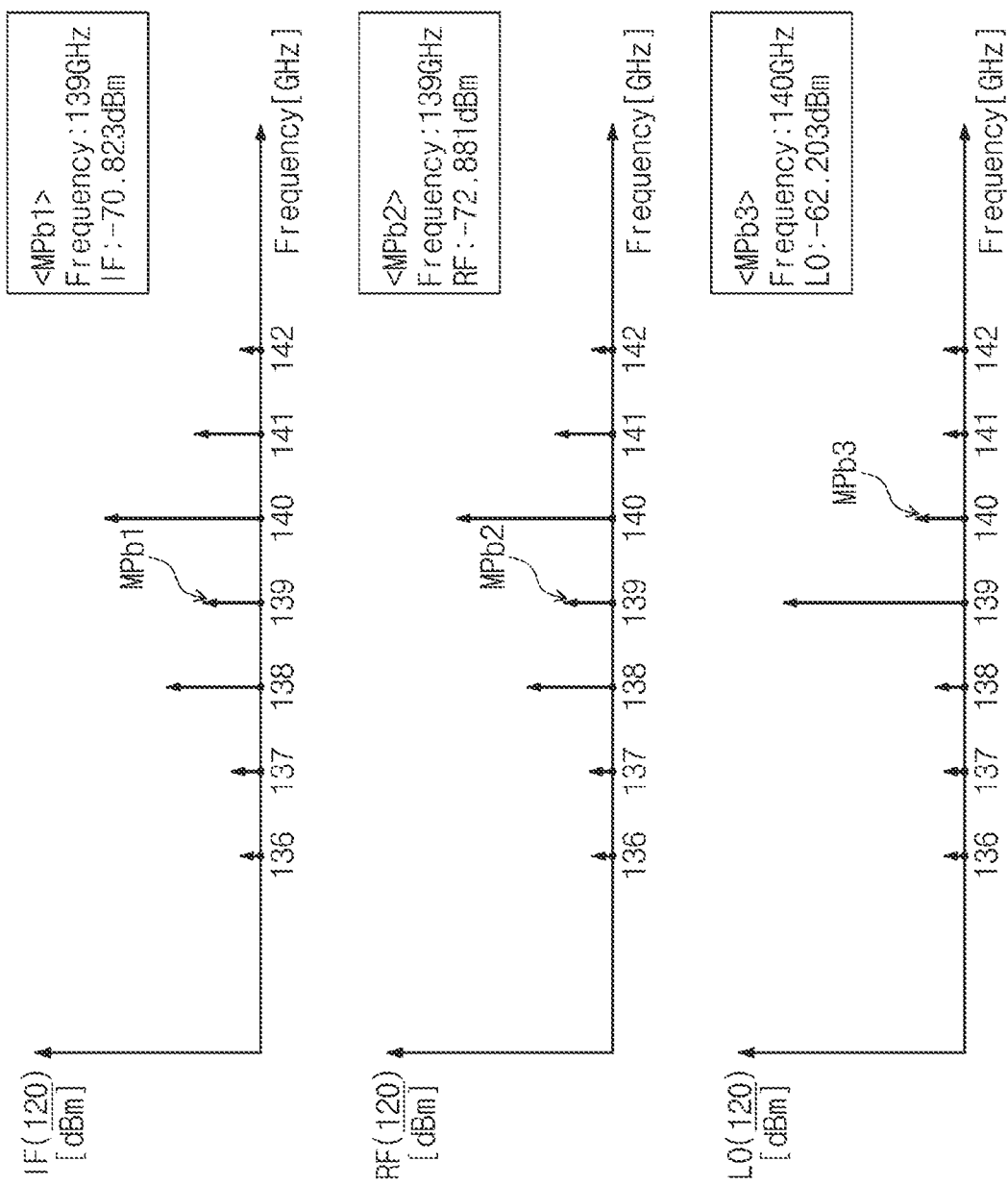
FIG. 5 is a diagram illustrating frequency signals of the non-linear circuit of FIG. 3.

FIG. 5 is a diagram illustrating frequency signals of the non-linear circuit of FIG. 3. Referring to FIGS. 3 and 5, according to embodiments of the present disclosure, spectral characteristics according to frequencies of an IF signal, an RF signal and an LO signal of the frequency mixer 100 including the non-linear circuit 120 will be described with reference to graphs. In the graphs, the horizontal axis represents the frequency and the vertical axis represents the power level.

According to simulation conditions, the frequency of the RF signal is 140 GHz, the frequency of the LO signal is 139 GHz, and the frequency of the IF signal is 1 GHz. The magnitude of the RF signal is −30 dBm, and the magnitude of the LO signal is −10 dBm.

With reference to the graph of the IF signal, the LO-to-IF isolation will be described. When the frequency of the LO signal is 139 GHz and the magnitude of the LO signal is −10 dBm, the measurement point MPb1 represents −70.823 dBm as a spectrum value of the IF signal. Therefore, the LO-to-IF isolation may be calculated as '−10-(−70.823) dBm'. That is, the LO-to-IF isolation is 60.823 dBm.

With reference to the graph of the RF signal, the LO-to-RF isolation will be described. When the frequency of the LO signal is 139 GHz and the magnitude of the LO signal is −10 dBm, a measurement point MPb2 represents −72.881 dBm as a spectrum value of the RF signal. Therefore, the LO-to-RF isolation may be calculated as '−10-(−72.881) dBm'. That is, the LO-to-RF isolation is 62.881 dBm.

With reference to the graph of the LO signal, the RF-to-LO isolation will be described. When the frequency of the RF signal is 140 GHz and the magnitude of the RF signal is −30 dBm, a measurement point MPb3 represents −62.203 dBm as a spectrum value of the LO signal. Therefore, the RF-to-LO isolation may be calculated as '−30-(−62.203) dBm'. That is, the RF-to-LO isolation is 32.203 dBm.

As described above, referring to FIGS. 4 and 5, the isolation of the frequency mixer 100 including the non-linear circuit 120 according to embodiments of the present disclosure may be higher than that of a frequency mixer including the general non-linear circuit NLC. That is, according to embodiments of the present disclosure, it is possible to provide a frequency mixer having improved LO-to-RF isolation, RF-to-LO isolation and LO-to-IF isolation.

Figure 6:
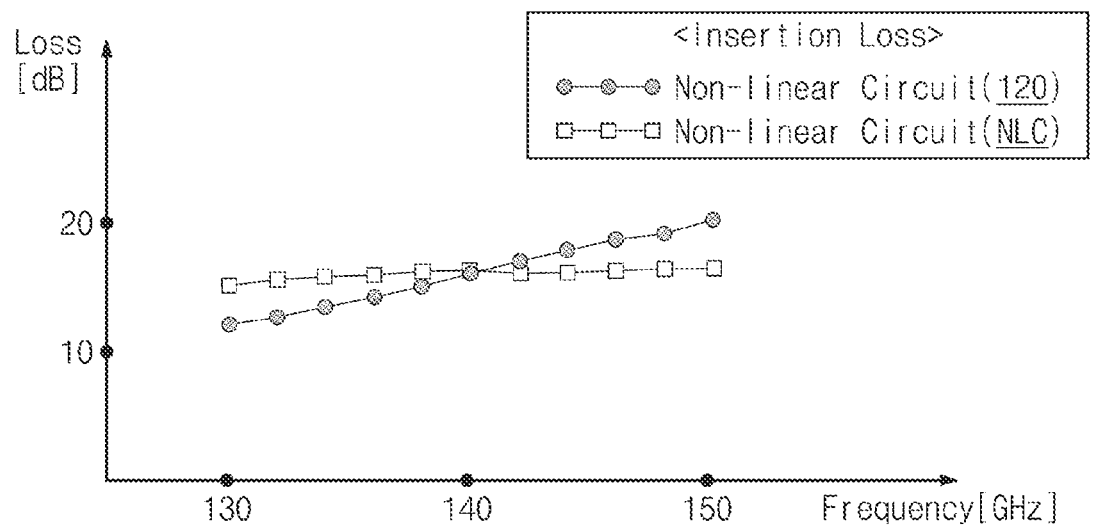
FIG. 6 is a graph illustrating insertion loss characteristics according to some embodiments of the present disclosure.

FIG. 6 is a graph illustrating insertion loss characteristics according to some embodiments of the present disclosure. With reference to FIG. 6, an insertion loss of the non-linear circuit 120 and an insertion loss of the general non-linear circuit NLC according to embodiments of the present disclosure will be described. The non-linear circuit 120 may correspond to the non-linear circuit 120 of FIG. 3. The general non-linear circuit NLC may correspond to the general non-linear circuit NLC of FIG. 2. In the graph, the horizontal axis represents the frequency, and the vertical axis represents the degree of the insertion loss.

According to simulation conditions, the frequency range of the RF signal is 130 to 150 GHz, the frequency range of the LO signal is 129 to 149 GHz, and the frequency of the IF signal is 1 GHz. The magnitude of the RF signal is −30 dBm, and the magnitude of the LO signal is −10 dBm.

Referring to the graph, the insertion loss of the frequency mixer 100 including the non-linear circuit 120 may be 12 to 20 dB. The insertion loss of a frequency mixer including the general non-linear circuit NLC may be 15 to 17 dB.

As described above, the insertion loss of the frequency mixer 100 including the non-linear circuit 120 according to embodiments of the present disclosure may be more uniform than the insertion loss of the frequency mixer including the general non-linear circuit NLC.

Figure 7:
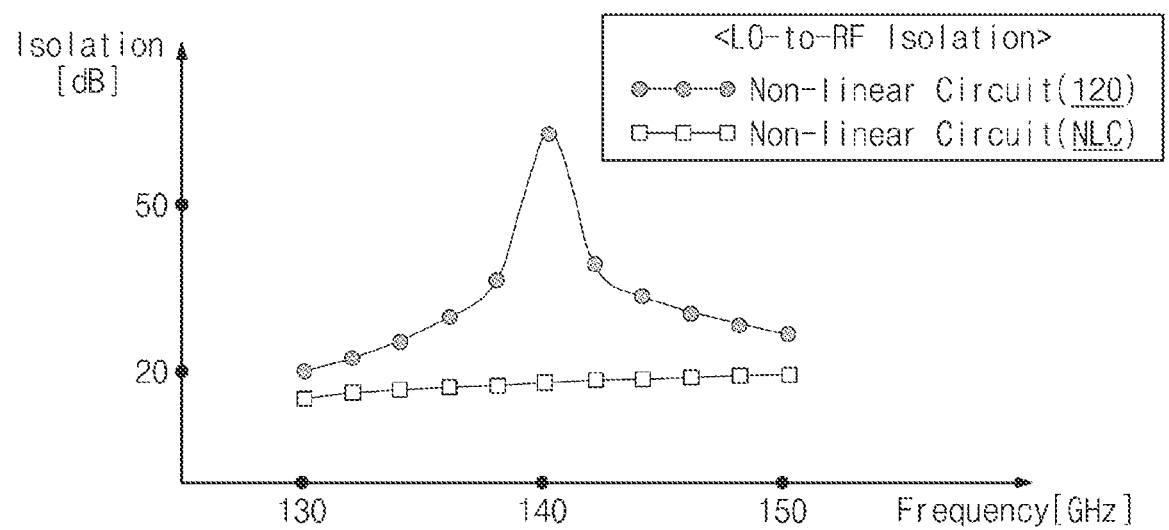
FIG. 7 is a graph illustrating LO-to-RF isolation according to some embodiments of the present disclosure.

FIG. 7 is a graph illustrating LO-to-RF isolation according to some embodiments of the present disclosure. With reference to FIG. 7, the LO-to-RF isolation of the non-linear circuit 120 and LO-to-RF isolation of the general non-linear circuit NLC according to embodiments of the present disclosure will be described. The non-linear circuit 120 may correspond to the non-linear circuit 120 of FIG. 3. The general non-linear circuit NLC may correspond to the general non-linear circuit NLC of FIG. 2. In the graph, the horizontal axis represents the frequency, and the vertical axis represents the degree of isolation.

According to simulation conditions, the frequency range of the RF signal is 130 to 150 GHz, the frequency range of the LO signal is 129 to 149 GHz, and the frequency of the IF signal is 1 GHz. The magnitude of the RF signal is −30 dBm, and the magnitude of the LO signal is −10 dBm.

Referring to the graph, the LO-to-RF isolation of the frequency mixer 100 including the non-linear circuit 120 may be 20 to 63 dB. The LO-to-RF isolation of the frequency mixer including the general non-linear circuit NLC may be 16 to 19 dB.

As described above, the LO-to-RF isolation of the frequency mixer 100 including the non-linear circuit 120 according to embodiments of the present disclosure may be higher than that of the frequency mixer including the general non-linear circuit NLC.

Figure 8:
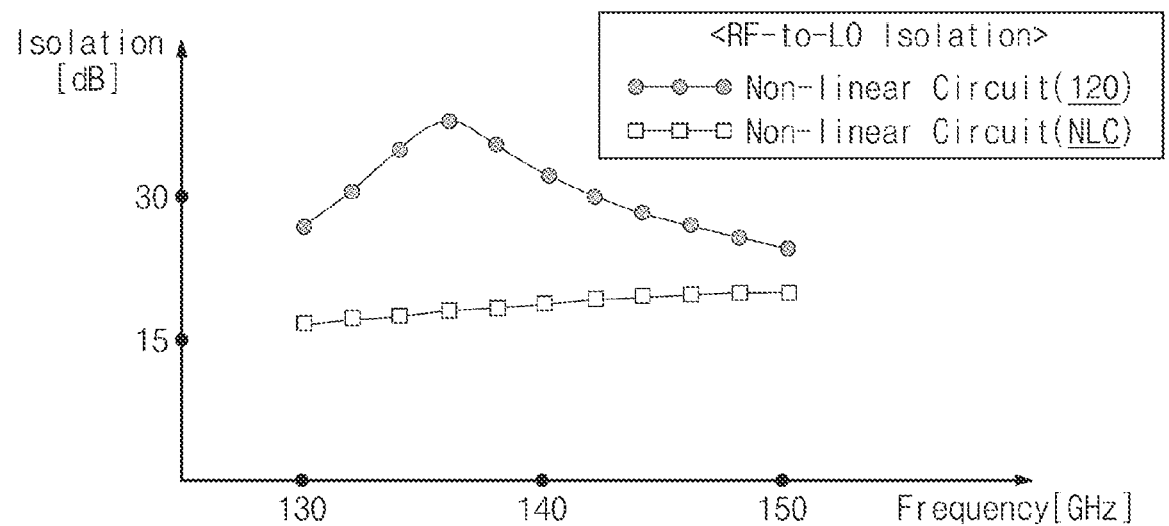
FIG. 8 is a graph illustrating RF-to-LO isolation according to some embodiments of the present disclosure.

FIG. 8 is a graph illustrating RF-to-LO isolation in accordance with some embodiments of the present disclosure. With reference to FIG. 8, the RF-to-LO isolation of the non-linear circuit 120 and the RF-to-LO isolation of the general non-linear circuit NLC according to embodiments of the present disclosure will be described. The non-linear circuit 120 may correspond to the non-linear circuit 120 of FIG. 3. The general non-linear circuit NLC may correspond to the general non-linear circuit NLC of FIG. 2. In the graph, the horizontal axis represents the frequency, and the vertical axis represents the degree of isolation.

According to simulation conditions, the frequency range of the RF signal is 130 to 150 GHz, the frequency range of the LO signal is 129 to 149 GHz, and the frequency of the IF signal is 1 GHz. The magnitude of the RF signal is −30 dBm, and the magnitude of the LO signal is −10 dBm.

Referring to the graph, the RF-to-LO isolation of the frequency mixer 100 including the non-linear circuit 120 may be 25 to 38 dB. The RF-to-LO isolation of the frequency mixer including the general non-linear circuit NLC may be 16 to 20 dB.

As described above, the RF-to-LO isolation of the frequency mixer 100 including the non-linear circuit 120 according to embodiments of the present disclosure may be higher than that of the frequency mixer including a general non-linear circuit (NLC).

Figure 9:
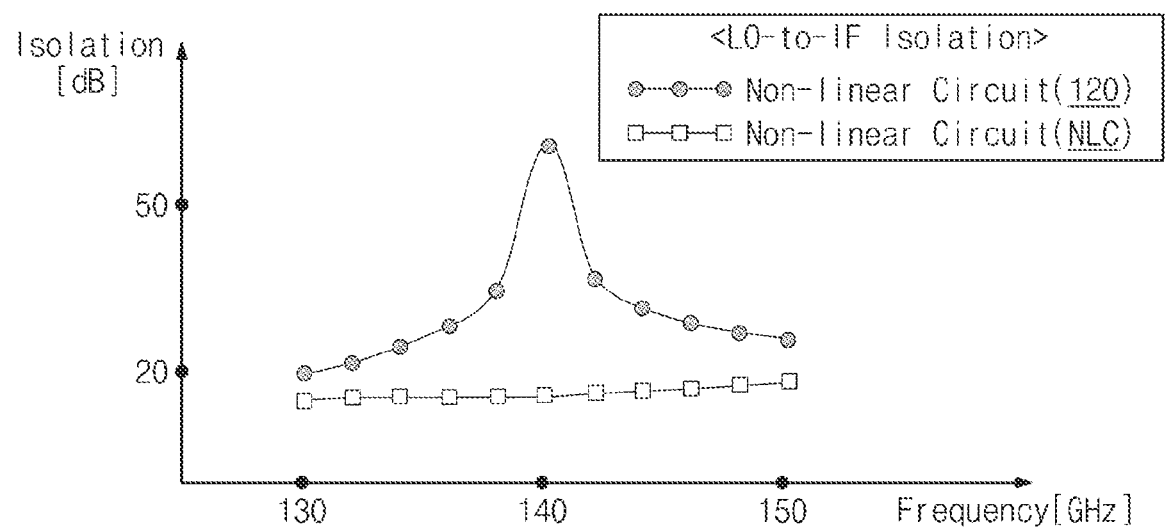
FIG. 9 is a graph illustrating LO-to-IF isolation according to some embodiments of the present disclosure.

FIG. 9 is a graph illustrating LO-to-IF isolation according to some embodiments of the present disclosure. With reference to FIG. 9, the LO-to-IF isolation of the non-linear circuit 120 and the LO-to-IF isolation of the general non-linear circuit NLC according to embodiments of the present disclosure will be described. The non-linear circuit 120 may correspond to the non-linear circuit 120 of FIG. 3. The general non-linear circuit NLC may correspond to the general non-linear circuit NLC of FIG. 2. In the graph, the horizontal axis represents the frequency, and the vertical axis represents the degree of isolation.

According to simulation conditions, the frequency range of the RF signal is 130 to 150 GHz, the frequency range of the LO signal is 129 to 149 GHz, and the frequency of the IF signal is 1 GHz. The magnitude of the RF signal is −30 dBm, and the magnitude of the LO signal is −10 dBm.

Referring to the graph, the LO-to-IF isolation of the frequency mixer 100 including the non-linear circuit 120 may be 20 to 61 dB. The LO-to-IF isolation of the frequency mixer including the general non-linear circuit NLC may be 15 to 17 dB.

As described above, the LO-to-IF isolation of the frequency mixer 100 including the non-linear circuit 120 according to embodiments of the present disclosure may be higher than that of the frequency mixer including the general non-linear circuit NLC.

According to an embodiment of the present disclosure, a frequency mixer including a non-linear circuit is provided.

In addition, based on the circuit structure of the non-linear circuit, a frequency mixer having improved insertion loss, linearity, and port-to-port isolation is provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A frequency mixer comprising:
   a first matching circuit configured to generate a matched local oscillator (LO) signal based on an LO signal;
   a non-linear circuit configured to generate a non-linear LO signal based on the matched LO signal;
   a second matching circuit configured to generate a matched radio frequency (RF) signal based on an RF signal;
   a mixing circuit configured to generate a mixed signal based on a mixing of the non-linear LO signal and the matched RF signal;
   a third matching circuit configured to generate an intermediate frequency (IF) signal based on the mixed signal,
   wherein the non-linear circuit includes a non-linear transistor, a bias transistor, and an internal matching circuit connected in series.

2. The frequency mixer of claim 1, wherein the internal matching circuit includes a resistor, an inductor and a capacitor which are connected in parallel.

3. The frequency mixer of claim 2, wherein a resistance of the resistor, an inductance of the inductor, and a capacitance of the capacitor are optimized to enhance at least one of an LO-to-RF isolation, an RF-to-LO isolation and an LO-to-IF isolation of the frequency mixer.

4. The frequency mixer of claim 1, wherein the bias transistor is configured to operate in response to a bias voltage, and
   wherein a level of the bias voltage is optimized to enhance at least one of an LO-to-RF isolation, an RF-to-LO isolation and an LO-to-IF isolation of the frequency mixer.

5. The frequency mixer of claim 1, wherein the bias transistor is configured to operate in response to a bias voltage, and
   wherein a level of the bias voltage is optimized to enhance at least one of an LO-to-RF isolation, an RF-to-LO isolation and an LO-to-IF isolation of the frequency mixer for a process change of an active element and a process change of a passive element occurring in a process of manufacturing the frequency mixer.

6. The frequency mixer of claim 1, wherein the non-linear circuit is connected between a terminal through which the non-linear LO signal is generated and a first node to operate in response to the matched LO signal,
   wherein the bias transistor is connected between the first node and a second node to operate in response to a bias voltage, and
   wherein the internal matching circuit is connected between the second node and a ground node.

7. The frequency mixer of claim 6, wherein the non-linear circuit further includes a bias voltage source configured to provide the bias voltage to a gate terminal of the bias transistor.

8. The frequency mixer of claim 6, wherein the internal matching circuit includes:
   a resistor connected between the second node and the ground node;
   an inductor connected between the second node and the ground node; and
   a capacitor connected between the second node and the ground node.

9. The frequency mixer of claim 6, wherein a drain terminal of the non-linear transistor is connected to the terminal through which the non-linear LO signal is generated, and a source terminal of the non-linear transistor is connected to the first node, and
   wherein a drain terminal of the bias transistor is connected to the first node and a source terminal of the bias transistor is connected to the second node.

10. The frequency mixer of claim 1, wherein each of the non-linear transistor and the bias transistor is implemented with at least one of an N-channel metal oxide semiconductor (NMOS) transistor, a GaAs pseudomorphic high electron mobility transistor (PHEMT), a GaAs metamorphic high electron mobility transistor (MHEMT), an InP high electron mobility transistor (HEMT), and a GaN field effect transistor (FET).

11. The frequency mixer of claim 1, wherein the frequency mixer includes a down-conversion frequency mixer that generates the IF signal having a third frequency obtained by subtracting a second frequency of the LO signal from a first frequency of the RF signal.

12. A frequency mixer that matches a local oscillator (LO) signal, generates a non-linear LO signal based on a matched LO signal, and generates an intermediate frequency (IF) signal based on the non-linear LO signal and a radio frequency (RF) signal, the frequency mixer comprising:
- a first transistor connected between a terminal through which the non-linear LO signal is generated and a first node to operate in response to the matched LO signal;
- a second transistor connected between the first node and a second node to operate in response to a bias voltage; and
- an internal matching circuit connected between the second node and a ground node.

13. The frequency mixer of claim 12, wherein the internal matching circuit includes:
- a resistor connected between the second node and the ground node;
- an inductor connected between the second node and the ground node; and
- a capacitor connected between the second node and the ground node.

14. The frequency mixer of claim 13, wherein a resistance of the resistor, an inductance of the inductor, and a capacitance of the capacitor are optimized to enhance at least one of an LO-to-RF isolation, an RF-to-LO isolation and an LO-to-IF isolation of the frequency mixer.

15. The frequency mixer of claim 12, further comprising:
- a bias voltage source configured to provide the bias voltage to a gate terminal of the second transistor.

16. The frequency mixer of claim 15, wherein a level of the bias voltage is optimized to enhance at least one of an LO-to-RF isolation, an RF-to-LO isolation and an LO-to-IF isolation of the frequency mixer for a process change of an active element and a process change of a passive element occurring in a process of manufacturing the frequency mixer.

* * * * *